(12) United States Patent
Son et al.

(10) Patent No.: US 11,335,944 B2
(45) Date of Patent: May 17, 2022

(54) SECONDARY BATTERY CHARGING/DISCHARGING DEVICE

(71) Applicant: LG CHEM, LTD., Seoul (KR)

(72) Inventors: Jae-Hyoung Son, Daejeon (KR); Chang-Bum Ahn, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 252 days.

(21) Appl. No.: 16/766,004

(22) PCT Filed: May 24, 2019

(86) PCT No.: PCT/KR2019/006284
§ 371 (c)(1),
(2) Date: May 21, 2020

(87) PCT Pub. No.: WO2020/032357
PCT Pub. Date: Feb. 13, 2020

(65) Prior Publication Data
US 2020/0280090 A1   Sep. 3, 2020

(30) Foreign Application Priority Data
Aug. 9, 2018   (KR) .................. 10-2018-0093227

(51) Int. Cl.
*H01M 10/38* (2006.01)
*H01M 10/04* (2006.01)
*H01M 10/44* (2006.01)

(52) U.S. Cl.
CPC ....... *H01M 10/0481* (2013.01); *H01M 10/44* (2013.01)

(58) Field of Classification Search
CPC ......... H01M 10/0481; H01M 10/0468; H01M 10/0472; H01M 10/44; H01M 10/441; H01M 10/446
See application file for complete search history.

(56) References Cited

U.S. PATENT DOCUMENTS 9,331,367 B2 * 5/2016 Shin .................. H01M 50/262
2002/0000786 A1   1/2002 Choi et al.
(Continued)

FOREIGN PATENT DOCUMENTS

JP   2002-169135 A   6/2002
KR   20-0384916 Y1   5/2005
(Continued)

OTHER PUBLICATIONS

International Search Report for PCT/KR2019/006284 dated Sep. 19, 2019.
(Continued)

*Primary Examiner* — Raymond Alejandro
(74) *Attorney, Agent, or Firm* — Birch, Stewart, Kolasch & Birch, LLP

(57) ABSTRACT

A charging and discharging apparatus for performing an activation process of a secondary battery including a plurality of compression plates spaced apart from each other by a predetermined distance to form a cell insert space into which a secondary battery cell is inserted, the plurality of compression plates moving to reduce the separated distance to press a body of the secondary battery cell; a slip sheet having a sheet shape and formed to include attachment portions attached to top ends of the compression plates and a folding portion formed by folding a region between the attachment portions to be interposed in the cell insert space; and a slip sheet fixing unit provided to be attached to and detached from the top end of the compression plate in a fitting and releasing manner in a state where the attachment portions of the slip sheet are interposed therein is provided.

13 Claims, 12 Drawing Sheets

(56) References Cited

U.S. PATENT DOCUMENTS

| | | | |
|---|---|---|---|
| 2002/0044253 A1 | 4/2002 | Masuda et al. | |
| 2012/0274280 A1* | 11/2012 | Yip | H02J 7/0048 320/112 |
| 2012/0312719 A1* | 12/2012 | Fan | H01M 50/264 206/703 |
| 2016/0111745 A1 | 4/2016 | Lee et al. | |
| 2016/0308242 A1 | 10/2016 | Ju | |
| 2018/0183020 A1* | 6/2018 | Ju | H01M 50/516 |

FOREIGN PATENT DOCUMENTS

| | | |
|---|---|---|
| KR | 10-2012-0138660 A | 12/2012 |
| KR | 10-2015-0050220 A | 5/2015 |
| KR | 10-1521267 B1 | 5/2015 |
| KR | 10-2015-0082957 A | 7/2015 |
| KR | 10-1553314 B1 | 9/2015 |
| KR | 10-2016-0046632 A | 4/2016 |
| KR | 10-2016-0123091 A | 10/2016 |
| KR | 10-2017-0059740 A | 5/2017 |

OTHER PUBLICATIONS

European Search Report for Appl. No 19848111.1 dated Nov. 3, 2020.

\* cited by examiner

SECONDARY BATTERY CHARGING/DISCHARGING DEVICE

TECHNICAL FIELD

The present disclosure relates to a secondary battery charging and discharging apparatus, and more particularly, to a secondary battery charging and discharging apparatus allowing simple and quick exchange of a slip sheet that supports a secondary battery cell.

The present application claims priority to Korean Patent Application No. 10-2018-0093227 filed on Aug. 9, 2018 in the Republic of Korea, the disclosures of which are incorporated herein by reference.

BACKGROUND ART

Generally, secondary batteries may be classified into cylindrical, rectangular and pouch-type secondary batteries depending on their shapes. Among them, the pouch-type secondary battery configures its appearance by using a metal layer (foil) and a pouch exterior made of a multilayer film having synthetic resin layers coated on an upper surface and a lower surface of the metal layer, so the weight of the battery may be significantly reduced compared to the cylindrical or rectangular secondary batteries. Thus, it is possible to reduce the weight of the battery and to be changed into various shapes.

In the pouch-type secondary battery, an electrode assembly is accommodated in a stacked form. An electrode tab and an electrode lead are connected to the electrode assembly, and the electrode lead protrudes from the pouch exterior. These electrode lead is electrically connected by contact with an external device to receive power from the external device.

The pouch-type secondary battery is manufactured by assembling cells and activating a battery. In the battery activation step, a secondary battery cell is mounted in a charging and discharging apparatus, and charging and discharging are performed under conditions necessary for activation. The process of performing predetermined charging and discharging using the charging and discharging apparatus to activate the battery is called a formation process.

In order to perform the formation process of the secondary battery, the secondary battery should be properly mounted to the charging and discharging apparatus. That is, the electrode lead of the secondary battery should be disposed to be in contact with a conductive portion of the charging and discharging apparatus so that the electrode lead is electrically connected to the conductive portion, and the electrical connection state must be maintained during charging and discharging.

To this end, the charging and discharging apparatus of the secondary battery generally includes a plurality of compression plates for fixing the secondary battery cells. The pouch-type secondary battery is inserted between two compression plates, and while applying a pressure from both sides, a current is applied through the leads of the secondary battery to perform charging.

Since the secondary battery cell is pressed using the compression plates as above, it is possible to suppress the increase in thickness of the secondary battery cell due to gas generation in the charging and discharging process. At this time, the generated gas is collected in a gas pocket and removed after the activation process. The gas pocket is a portion of the pouch exterior that extends in the direction intersecting the electrode lead from a cell body portion that is pressurized in the activation process. The gas pocket may be cut off later from the pouch exterior.

Meanwhile, when the formation process is performed using the conventional secondary battery charging and discharging apparatus, as shown in FIG. 1, a body of a secondary battery cell 2 is pressed using a compression plate 3 in a state where the secondary battery cell 2 is held at a predetermined height using a slip sheet 4.

The slip sheet 4 may be folded in multiple layers to be interposed in the space between the compression plates 3, and the rest portions may be fixed to a top end of the compression plate 3. For example, as shown in FIG. 2, a portion of slip sheet 4 is placed on the top end of the compression plate 3, a bracket 5 is placed thereon, and then a bolt 6 is fastened thereto to fix the slip sheet 4 to the top end of the compression plate 3.

However, in the conventional secondary battery charging and discharging apparatus as described above, in order to exchange the slip sheet 4, the bolts 6 should be removed from all the compression plates 3, then the slip sheet 4 should be exchanged, and then the bolts 6 should be fastened again. Thus, it takes a long time to exchange the slip sheet 4. In addition, in order to exchange the compression plates or their associated components, the bolts should be fastened again after the slip sheet is exchanged, which takes a long time likewise. Thus, there is a need for a method that may stably fix the slip sheet to the compression plates and also may quickly and conveniently separate the slip sheet when necessary.

DISCLOSURE

Technical Problem

The present disclosure is designed to solve the problems of the related art, and therefore the present disclosure is directed to providing a secondary battery charging and discharging apparatus, which may allow quick and convenient exchange of a slip sheet, which supports a secondary battery cell during charging and discharging, and relevant parts.

However, the technical problem to be solved by the present disclosure is not limited to the above-described problem, and other problems not mentioned herein will be clearly understood by those skilled in the art from the following description.

Technical Solution

In one aspect of the present disclosure, there is provided a charging and discharging apparatus for performing an activation process of a secondary battery, comprising: a plurality of compression plates disposed spaceable apart from each other by a predetermined distance to form a cell insert space into which a secondary battery cell is insertable, the plurality of compression plates being movable towards each other to press a body of the secondary battery cell inserted into the cell insert space; a slip sheet having a sheet shape, the slip sheet including attachment portions attachable to top ends of the compression plates and a folding portion formed by folding a region between the attachment portions to be interposed in the cell insert space; and a plurality of slip sheet fixing units provided to be attached to and detached from the top ends of the compression plates in a fitting and releasing manner in a state where the attachment portions of the slip sheet are interposed therein.

Each slip sheet fixing unit may include a slip sheet bracket provided to face the top end of a corresponding compression plate of the compression plates; and slip sheet fixing pins orthogonally coupled to a lower portion of the slip sheet bracket, wherein the slip sheet fixing pins may be fitted into fitting grooves concavely formed at the top ends of the compression plates through the attachment portions of the slip sheet.

The charging and discharging apparatus may further comprise a washer plate installed at the top end of the corresponding compression plate of the compression plates to face the slip sheet bracket, wherein one of the attachment portions of the slip sheet may be compressed between the slip sheet bracket and the washer plate.

The slip sheet bracket may include a plurality of unit slip sheet brackets that are separatable from each other.

The charging and discharging apparatus may further comprise cell entry guides orthogonally coupled to an upper portion of each of the slip sheet brackets and shaped to have a surface inclined or curved toward the cell insert space.

The cell entry guides may be coupled to be slidable along a longitudinal direction of the each of the slip sheet brackets and disposed at predesignated positions.

Each of the cell entry guides may include a guide coupling portion slidably connected to a corresponding slip sheet bracket of the slip sheet brackets, and a guide-shaping portion integrally formed with the guide coupling portion, the guide coupling portion having the surface inclined or curved toward the cell insert space.

The guide coupling portion of each cell entry guide may include a ball plunger that is configured to move by rolling along an upper surface of the corresponding slip sheet bracket and is inserted into any one position setting grooves of position setting grooves concavely formed at predesignated positions on the upper surface of the corresponding slip sheet bracket so that the guide coupling portion is movable and fixable by the ball plunger.

Each slip sheet bracket may include a guide movement region in which an upper body thereof has a width greater than a lower body thereof; and a guide separation region in which an upper body and a lower body thereof have the same width, and wherein the guide coupling portion of the cell entry guide may be perpendicularly inserted into the guide separation region and surround the upper body of the guide movement region to prevent separation from the guide movement region in an upper and lower direction, and the guide coupling portion may be configured to be caught by a lower end of the upper body in the upper and lower direction.

Each slip sheet bracket may include a plurality of unit slip sheet brackets, which are separatable from each other, and the guide separation regions of the unit slip sheet brackets may be disposed to be connected to each other.

The charging and discharging apparatus may further comprise gripper units respectively coupled to each compression plate of the plurality of compression plates to move integrally with each compression plate, wherein, when adjacent compression plates compress the body of the secondary battery cell, the gripper units press and contact electrode leads of the secondary battery cell.

The charging and discharging apparatus may further comprise push bar units respectively mounted adjacent to the gripper units, the push bar units may be configured to press a terrace portion of the secondary battery cell adjacent to the electrode lead.

The plurality of compression plates may include at least three compression plates, and a total number of cell insert spaces may be one less that a total number of the at least three compression plates.

Advantageous Effects

According to an embodiment of the present disclosure, it is possible to provide a secondary battery charging and discharging apparatus, which may allow quick and convenient exchange of a slip sheet, which supports a secondary battery cell during charging and discharging, and relevant parts.

According to another embodiment of the present disclosure, since the secondary battery cells are guided by the cell entry guide when being loaded in the secondary battery charging and discharging apparatus, the secondary battery cells may be efficiently loaded at proper positions.

According to another embodiment of the present disclosure, since the cell entry guide is coupled to the slip sheet bracket to be movable in a left and right direction, it is very convenient to adjust the position of the cell entry guide and to install and separate the cell entry guide.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

A secondary battery charging and discharging apparatus according to the present disclosure described below refers to a device for activating a secondary battery cell by charging and discharging the secondary battery cell that is not activated after being completely assembled. The secondary battery charging and discharging apparatus is not only mainly used for activating the secondary battery cell, but also may be used to test the performance of the secondary battery cell, for example to check whether the cell is shorted.

Figure 1:
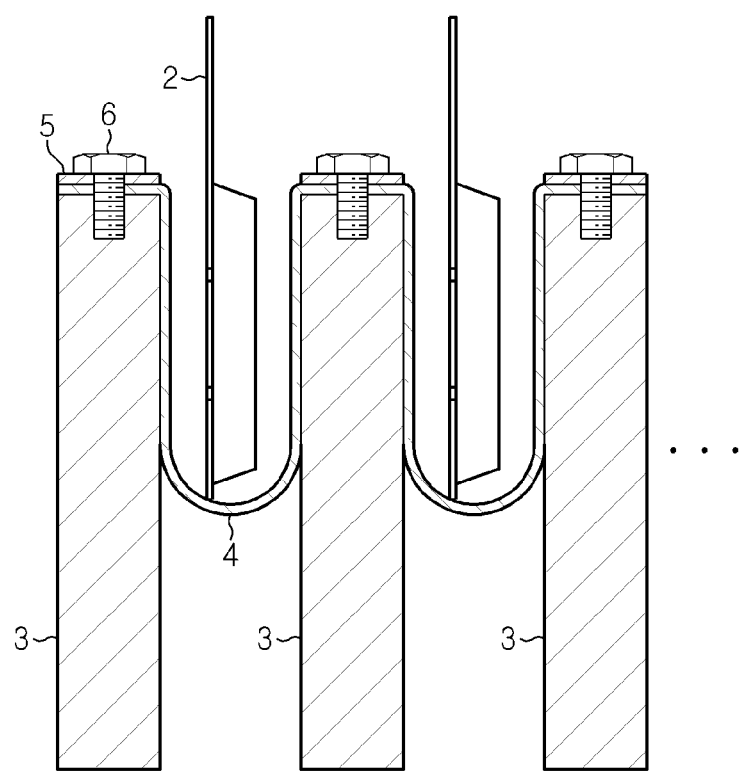
FIGS. 1 and 2 are a side view and a top view schematically showing a portion of a conventional secondary battery charging and discharging apparatus in which a slip sheet is fixed using a bolt.
Figure 2:
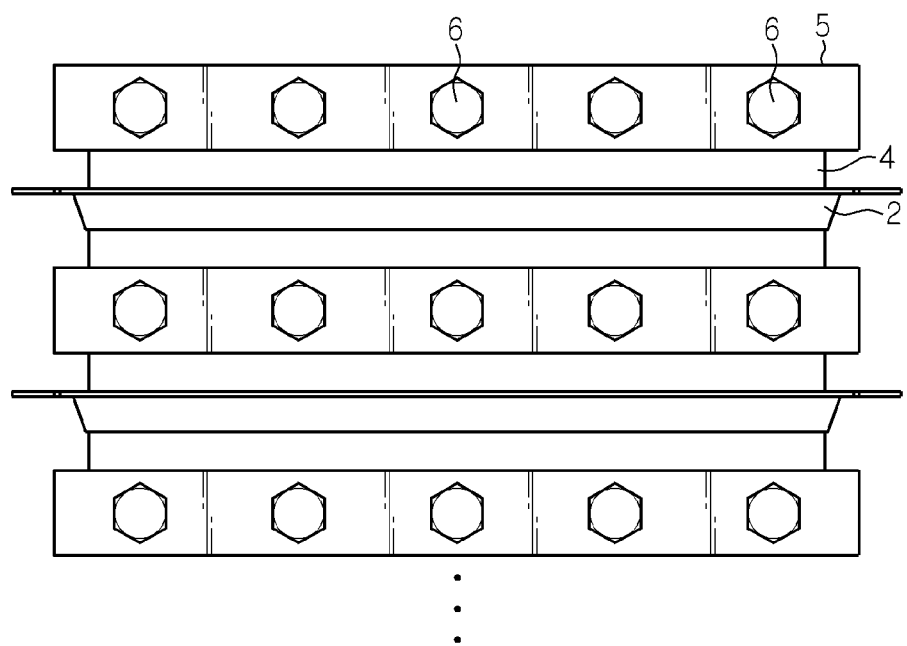
Figure 3:
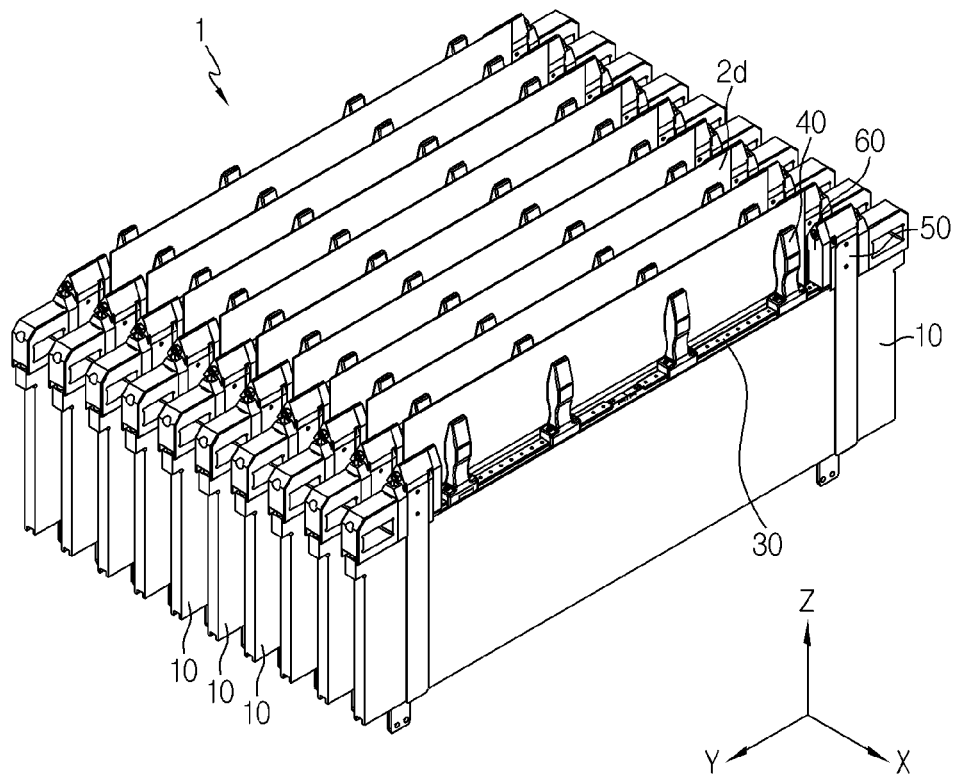
FIG. 3 is a perspective view schematically showing a charging and discharging apparatus according to an embodiment of the present disclosure.
Figure 4:
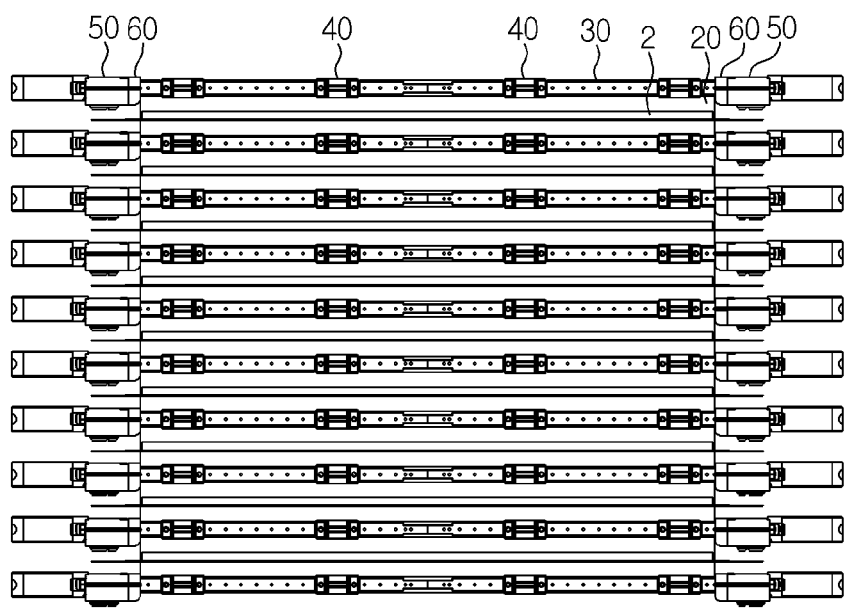
FIG. 4 is a top view of FIG. 3.
Figure 5:
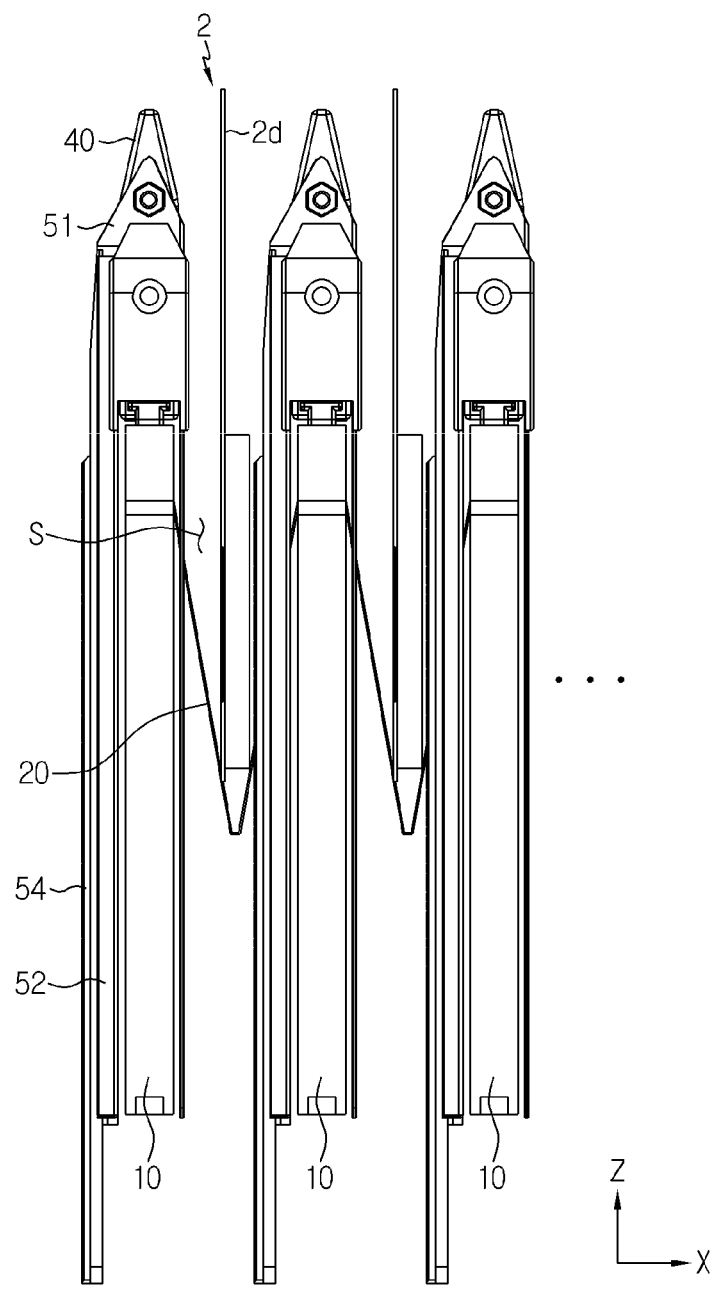
FIG. 5 is a side view showing a portion of FIG. 3.

FIG. 3 is a perspective view schematically showing a charging and discharging apparatus according to an embodiment of the present disclosure, FIG. 4 is a top view of FIG. 3, and FIG. 5 is a side view showing a portion of FIG. 3.

Referring to these figures, a secondary battery charging and discharging apparatus 1 according to an embodiment of the present disclosure may include a plurality of compression plates 10, a slip sheet 20, a slip sheet fixing unit 30, cell entry guides 40, gripper units 50, and push bar units 60.

In the charging and discharging process, secondary battery cells 2 may experience swelling due to expansion or gas generation of a positive electrode plate and a negative electrode plate. The compression plates 10 pressurize the secondary battery cells 2 in the charging and discharging process to prevent swelling.

The compression plates 10 are spaced apart from each other by a predetermined distance and are configured to move (in the ±X-axis direction) so that the separated space is narrowed or widened. The separated space is formed such that at least one secondary battery cell 2 may be inserted therein. Hereinafter, the separated space will be defined as a cell insert space S.

Although not shown for convenience, the compression plates 10 are connected to translate along a shaft extending in the X-axis direction in a lower region thereof, gears are connected to one end of the shaft, and a drive motor may be connected to the gears. Here, any mechanical combination may be employed as long as it has a drive mechanism capable of moving the compression plates 10 in the direction along which the secondary battery cell 2 is pressed.

The compression plates 10 may be preferably made of metal with high mechanical stiffness to avoid deformation under high heat and pressure. Here, the present disclosure should not be limited to the compression plates 10 made of metal. For example, the compression plate 10 may be made of stainless steel, tempered plastic, tempered ceramic, tempered glass, or the like.

Between the compression plates 10, as shown in FIGS. 3 and 4, the secondary battery cells 2 having a gas pocket 2d in an inactive state may be transported using a pick-up device and inserted and placed one by one.

At this time, as shown in FIG. 5, a slip sheet 20 is used to hold the secondary battery cell 2 to a certain height and to protect a surface of the secondary battery cell body 2a from the compression plate 10 when being pressurized.

The slip sheet 20 is in a sheet shape and may be configured to include attachment portions 21 attached to a top end of the compression plates 10 and a folding portion 22 interposed in the cell insert space S by folding a region between the attachment portions 21.

Figure 6:
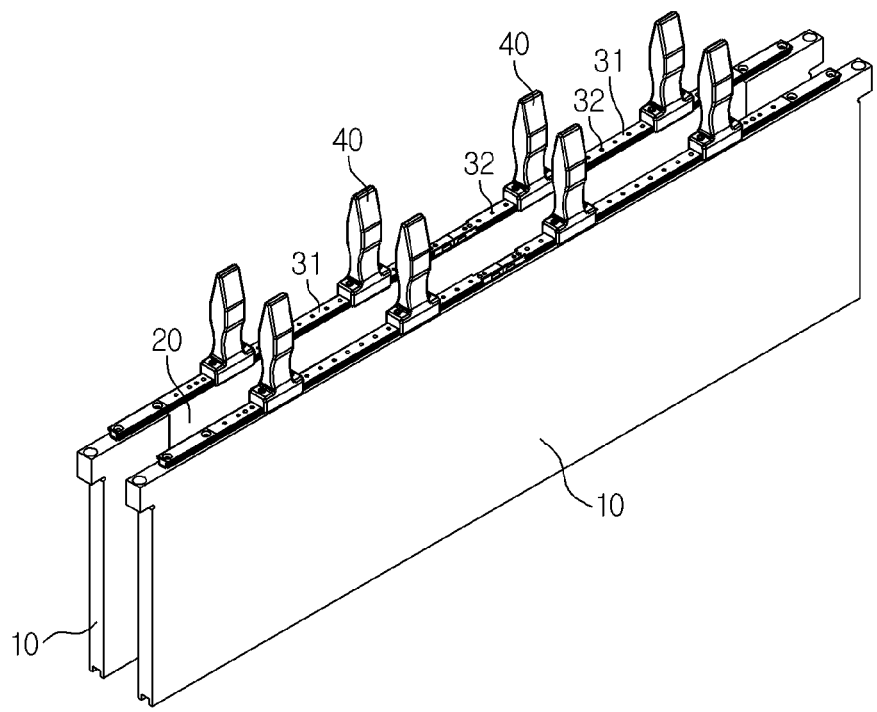
FIG. 6 is a perspective view showing a pair of compression plates and slip sheet brackets according to an embodiment of the present disclosure in an assembled state.
Figure 7:
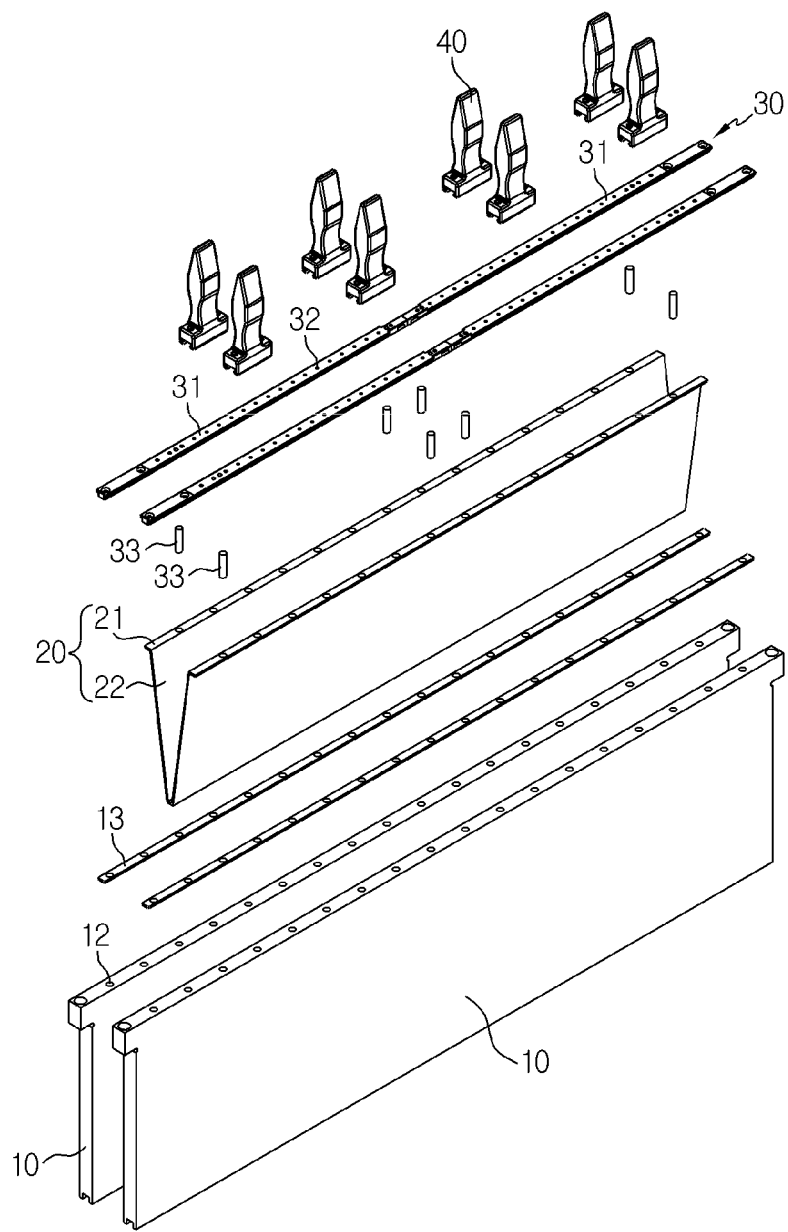
FIG. 7 is an exploded perspective view of FIG. 6.

For example, as shown in FIGS. 6 and 7, the slip sheet 20 is configured such that the rectangular sheet is folded in half so that the folded portion is inserted into the cell insert space S and both edges are attached to the top ends of the two compression plates 10, respectively. Both edges correspond to the attachment portions 21, and the region between the attachment portions 21 corresponds to the folding portion 22.

In this embodiment, one slip sheet 20 is used per two compression plates 10. However, as an alternative, one large rectangular face sheet may be folded several times to make one slip sheet 20 having two or more folding portions 22 and three or more attachment portions 21, and this slip sheet 20 may be applied to three or more compression plates 10.

The slip sheet fixing unit 30 plays a role of fixing the attachment portions 21 of the slip sheet 20 to the top end of the compression plate 10. As explained in detail later, in this embodiment, the slip sheet fixing unit 30 may be attached to and detached from the top end of the compression plate 10 in a fitting and releasing manner in a state where the attachment portion 21 of the slip sheet 20 is interposed therein, without using the conventional bolt-releasing and bolt-refastening method. In this way, it is possible to significantly reduce the time required to exchange the slip sheet 20 and its associated components.

As shown in FIGS. 6 to 9, the slip sheet fixing unit 30 may include a slip sheet bracket 31 provided to face the top end of the compression plate 10 and slip sheet fixing pins 33 orthogonally coupled to a lower portion of the slip sheet bracket 31.

The slip sheet bracket 31 may be placed on the attachment portions 21 of the slip sheet 20 along a top line of the compression plate 10 so as to cover the entire attachment portions 21 of the slip sheet 20. In addition, the slip sheet bracket 31 may include unit slip sheet brackets 31 that may be separated from each other, so that the unit slip sheet brackets 31 are detachably attached individually to the top ends of the compression plates 10, respectively.

The slip sheet fixing pins 33 may be fitted into fitting grooves 12 concavely formed recessed at the top end of the compression plate 10 in one-to-one relationship after vertically passing through the attachment portions 21 of the slip sheet 20.

In addition, by attaching the washer plate 13 to the top end of the compression plate 10, it is possible to prevent damage to the top surface of the compression plate 10 and strengthen the coupling force when the slip sheet bracket 31 is mounted.

Figure 8:
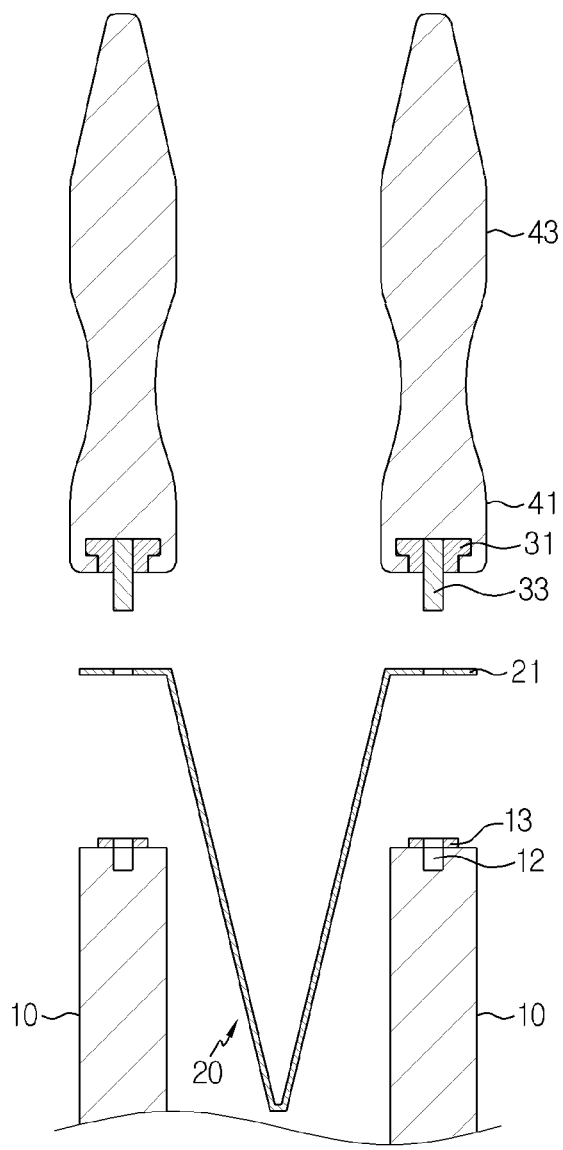
FIGS. 8 and 9 are diagrams for illustrating an assembling process of the slip sheet of the charging and discharging apparatus according to an embodiment of the present disclosure.
Figure 9:
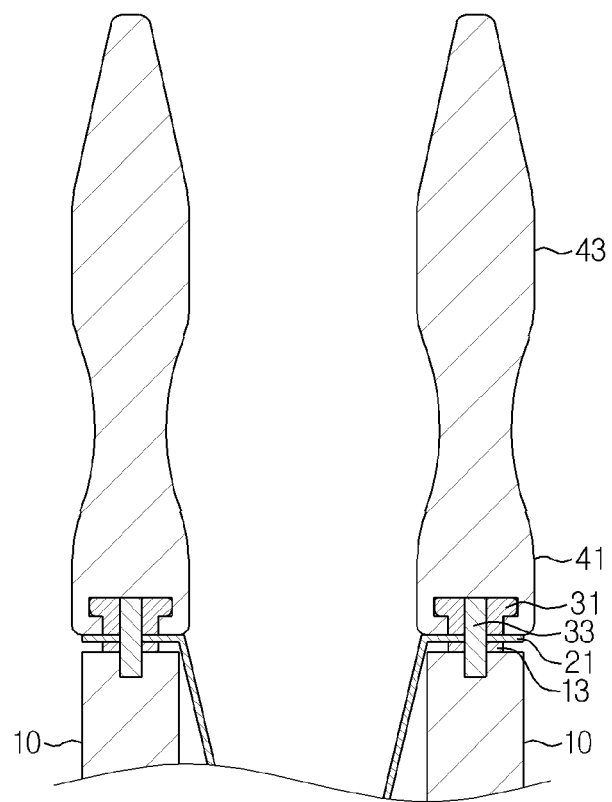

According to this configuration, as shown in FIGS. 8 and 9, the attachment portion 21 of the slip sheet 20 is placed on the top end of the compression plate 10, and in a state where the slip sheet fixing pins 33 are aligned with the fitting grooves 12, the slip sheet bracket 31 is pressed against the top end of the compression plate 10, thereby simply and quickly assembling the slip sheet 20 to the compression plate 10. A disassembling process of the slip sheet 20 is reverse to the assembling process and may be performed simply and quickly.

The cell entry guide 40, explained later, may be coupled orthogonally to an upper portion of the slip sheet bracket 31. A user may grip the cell entry guide 40 and move the slip sheet bracket 31 up and down, which makes it easier to attach or detach the slip sheet bracket 31 to/from the top end of the compression plate 10.

Thus, in order to exchange the slip sheet 20, the user grips the cell entry guide 40, lifts the slip sheet bracket 31 itself, remove the existing slip sheet 20, insert a new slip sheet 20 into the cell insert space S, and then mount the slip sheet bracket 31 again to the top end of the compression plate 10. Thus, the time required to exchange the slip sheet 20 may be significantly shortened.

Meanwhile, the cell entry guide 40 serves as a handle for attaching and detaching the slip sheet bracket 31 and also plays a role of guiding the secondary battery cells 2 into to the respective cell insert space S accurately when the secondary battery cells 2 are loaded between the compression plates 10.

Figure 10:
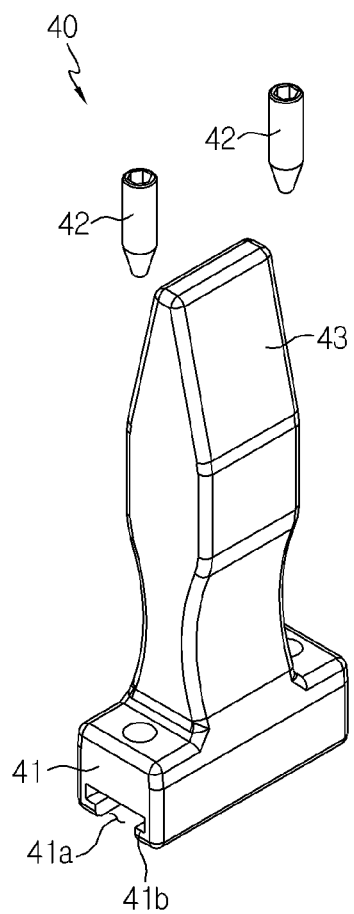
FIG. 10 is a perspective view showing a cell entry guide according to an embodiment of the present disclosure.
Figure 11:
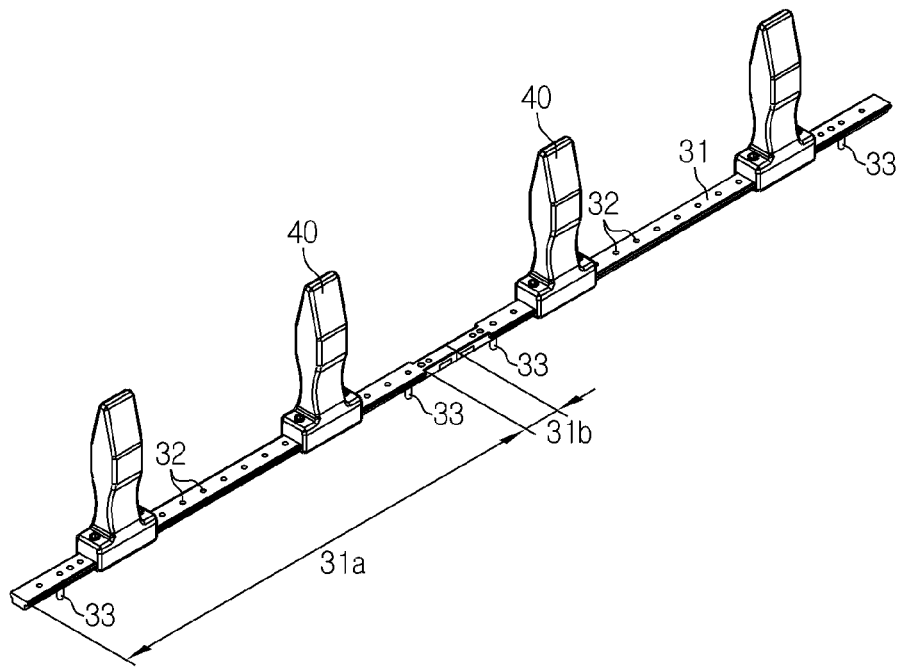
FIG. 11 is a perspective view showing the cell entry guide of FIG. 10 and the slip sheet bracket in an assembled state.
Figure 12:
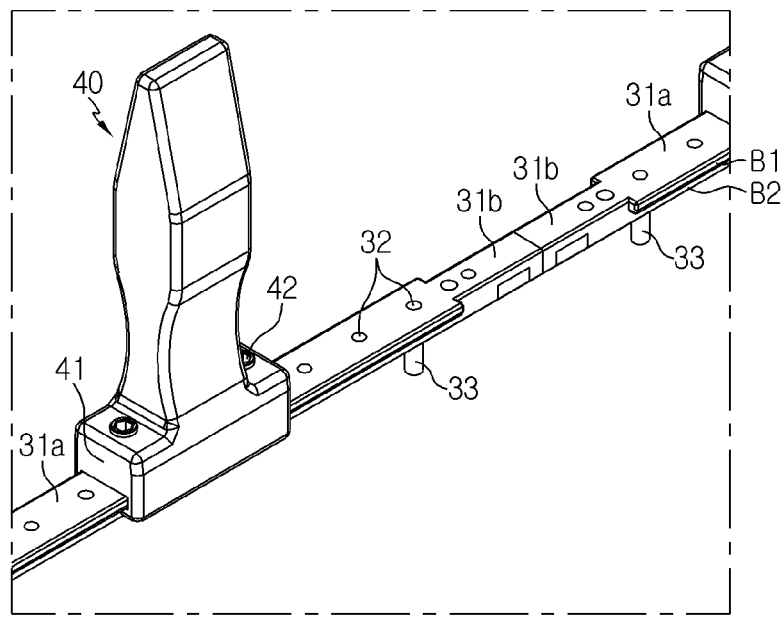
FIG. 12 is an enlarged view showing a main part of FIG. 11.

Referring to FIGS. 10 to 12, the cell entry guide 40 includes a guide coupling portion 41 slidably connected to the slip sheet bracket 31 and a guide-shaping portion 43 formed integrally with the guide coupling portion 41 and having the inclined or curved surface. The cell entry guide 40 may be arranged at predetermined positions along the longitudinal direction of the slip sheet bracket 31 one by one.

If the cell entry guide 40 is used, even though there is a slight error when loading the secondary battery cell 2, the secondary battery cell 2 may move down along the inclined or curved surface of the guide-shaping portion 43 to compensate for the error of the cell loading position.

Thus, the secondary battery cell 2 may be loaded more easily, and it is possible to prevent the cell from being damaged by hitting or leaving the top end of the slip sheet bracket 31 or the compression plate 10 while the secondary battery cell 2 is being loaded. The cell entry guide 40 may be made of a nylon-based plastic material (PA66) or a fiber-reinforced plastic material (GF66) having excellent heat resistance and strength.

In this embodiment, four cell entry guides 40 are installed in total, namely two cell entry guides 40 are installed at each of two unit slip sheet brackets 31. Here, the cell entry guides 40 are proportionally distributed in consideration of the length of the loaded secondary battery cell 2. When a secondary battery cell 2 having a shorter length than that of this embodiment is loaded in the cell insert spaces S, the gap between the cell entry guides 40 needs to be narrowed.

To this end, the cell entry guides 40 are provided such that the guide coupling portion 41 may slide in a left and right direction along the slip sheet bracket 31.

Specifically, referring to FIGS. 10 to 12, the guide coupling portion 41 has a fitting hole 41a and a holding protrusion 41b at a lower side thereof and is configured to be fitted onto the slip sheet bracket 31 and placed thereon. The fitting hole 41a is an empty space formed by cutting a lower central region of the guide coupling portion 41 along the longitudinal direction thereof and shaped be vertically matched with the slip sheet bracket 31, and an upper space of the fitting hole 41a has a greater width than a lower space thereof.

The slip sheet bracket 31 coupled to the guide coupling portion 41 includes a guide movement region 31a and a guide separation region 31b. The guide movement region 31a has an upper body B1 whose width corresponds to the upper space of the fitting hole 41a and a lower body B2 whose width is smaller than the width of the upper body B1 and corresponds to the lower space of the fitting hole 41a. The guide separation region 31b has a body corresponding to the lower space of the fitting hole 41a.

As described above, the slip sheet bracket 31 includes two unit slip sheet brackets 31 that are separable from each other. As shown in FIG. 12, guide separation regions 31b of the two unit slip sheet brackets 31 are connected to each other, and the cell entry guide 40 may be inserted downward from the top of the guide separation region 31b of the two unit slip sheet brackets 31. After being inserted as above, the cell entry guide 40 may be moved in a left and right direction and located at the guide movement region 31a.

In addition, the cell entry guide 40 located at the guide movement region 31a is not separated from the guide movement region 31a since the guide coupling portion 41 is shaped to surround the upper body B1 of the guide movement region 31a and the holding protrusion 41b is caught by a lower end of the upper body B1.

Also, the guide coupling portion 41 may have a ball plunger 42 that moves by rolling along the upper surface of the slip sheet bracket 31 and is inserted into any one of position setting grooves 32 concavely formed at predesignated positions on the upper surface of the slip sheet bracket 31.

The ball plunger 42 may be coupled to perpendicularly pass through the upper surface of the guide coupling portion 41 such that a ball portion of the ball plunger 42 is located in the fitting hole 41a. The ball plunger 42 may be provided at both sides of the guide-shaping portion 43 one by one.

The ball portion of the ball plunger 42 may be fitted and accommodated in any one of the position setting grooves 32 provided at the upper surface of the guide movement region 31a, for example at the upper surface of the slip sheet bracket 31, at regular intervals.

According to the configuration of the ball plunger 42 as described above, when the cell entry guide 40 slides in the left and right direction, the friction force is reduced to smoothen the movement. Also, since the position setting grooves 32 are provided at the upper surface of the slip sheet bracket 31, it becomes easy to adjust the interval between the cell entry guides 40, and the cell entry guides 40 may be easily fixed at the displaced positions.

Meanwhile, the gripper units 50 play a role of contacting the electrode leads 2c of the pouch-type secondary batteries to apply a current to the secondary battery cell 2 or detect a voltage. In particular, the gripper units 50 according to an embodiment of the present disclosure are provided to be placed on the compression plates 10, respectively, so as to be moved integrally with the compression plate 10.

In this embodiment, referring to FIGS. 3 to 5 and 13 together, two gripper units 50 are mounted to both edges of the top end of the compression plates 10 one by one, such that the electrode lead 2c of the secondary battery cell 2 are contacted under pressure in the X-axis direction by the gripper unit 50. The positions of the two gripper units 50 may be adjusted according to the position of electrode lead 2c of the secondary battery cell 2.

That is, the gripper units 50 may be placed at positions corresponding to the electrode leads 2c of the secondary battery cell 2 so that the compression plates 10 press and contact the electrode leads 2c when pressing the body 2a of the secondary battery cells 2.

Figure 13:
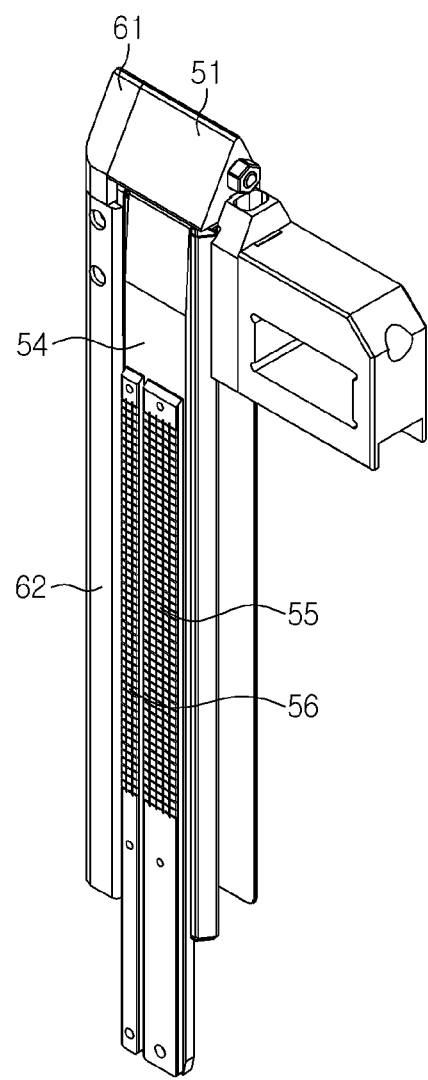
FIG. 13 is a perspective view showing a gripper unit and a push bar unit according to an embodiment of the present disclosure in an assembled state.

As shown in FIG. 13, the gripper unit 50 may include a gripper head 51 placed on an upper portion of the compression plate 10 and a gripper pressing portion 54 connected to the gripper head 51 and extending downward to the cell insert space S.

The gripper pressing portion 54 is disposed to overlap with at least one of a front surface and a rear surface of the compression plate 10 to press the electrode lead 2c in the charging and discharging process. A current terminal 55 for applying a current to the secondary battery cell 2 and a voltage terminal 56 for detecting a voltage may be mounted to the gripper pressing portion 54.

The push bar units 60 play a role of suppressing terrace portions 2b of the secondary battery cells 2 in the charging and discharging process to suppress swelling at the corresponding portion. Here, the terrace portion 2b of the secondary battery cell 2 refers to a rim portion of the heat-sealed pouch at which the electrode lead 2c is drawn out. Due to the positions of the electrode lead 2c and the cell terrace portion 2b, the push bar units 60 are mounted on the compression plate 10 to be directly adjacent to the gripper units 50.

Referring to FIGS. 3 and 13 again, the push bar unit 60 may include a push bar head 61 bolted to the gripper head 51 and mounted to the upper portion of the compression plate 10 and a push bar pressing portion 62 extending to the cell insert space S from the push bar head 61 and disposed parallel to the gripper pressing portion 54.

The push bar pressing portion 62 may be implemented in a bar shape having a width T and a length corresponding to the cell terrace portion 2b, and may be made of an epoxy material in consideration that the push bar pressing portion 62 directly contacts the cell terrace portion 2b. Here, the push bar pressing portion 62 may be made of any material as long as it has insulation, heat resistance, mechanical rigidity, and the like.

Figure 14:
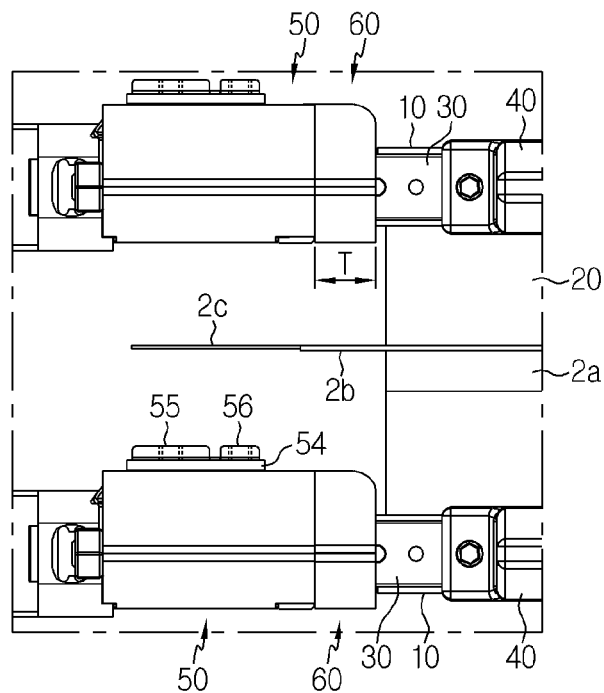
FIGS. 14 and 15 are enlarged top views showing the gripper unit and the push bar unit before and after the secondary battery cell according to an embodiment of the present disclosure is pressed.
Figure 15:
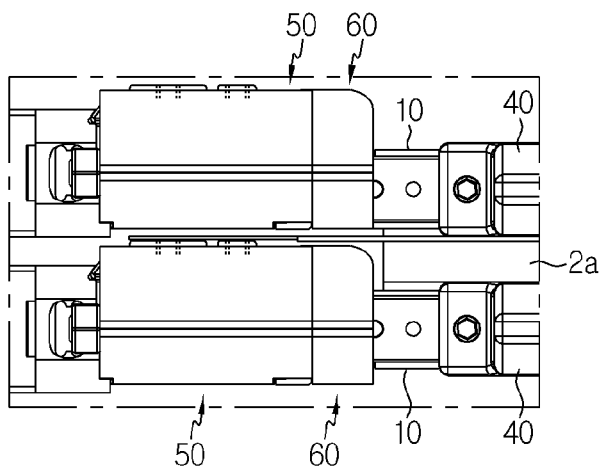

FIGS. 14 and 15 are enlarged top views showing the gripper unit 50 and the push bar unit 60 before and after the secondary battery cell 2 according to an embodiment of the present disclosure is pressed, respectively.

Referring to these figures, a pressing process for pressurizing the electrode lead 2c and the cell terrace portion 2b of the secondary battery cell 2 according to an embodiment of the present disclosure will be briefly explained as follows.

First, the secondary battery cells 2 to be activated are loaded between the compression plates 10, respectively. As shown in FIG. 14, the loaded secondary battery cell 2 is provided such that the electrode lead 2c is positioned at a front portion of the gripper pressing portion 54 (in the X-axis direction) and the cell terrace portion 2b is positioned at a front portion of the push bar pressing portion 62.

If the drive motor is operated in this state, as shown in FIG. 15, the compression plates 10 pressurize the body 2a of the secondary battery cell 2. At this time, the electrode lead 2c may be compressed by the gripper pressing portion 54, and the cell terrace portion 2b may be compressed by the push bar pressing portion 62.

Accordingly, in the charging and discharging process, the cell terrace portion 2b may be pressed by the push bar pressing portion 62, thereby preventing the cell terrace portion 2b from swelling due to the generation of gas inside the secondary battery cell 2. Thus, it is possible to significantly reduce the insulation voltage defect, which is caused in the conventional art as the cell terrace portion 2b swells to break the insulation layer in the charging and discharging process.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, even though the terms expressing directions such as "upper", "lower", "left" and "right" are used in the specification, they are just for convenience of description and can be expressed differently depending on the position of a viewer or a subject, as apparent to those skilled in the art.

What is claimed is:

1. A charging and discharging apparatus for performing an activation process of a secondary battery, comprising:
   a plurality of compression plates disposed to be spaceable apart from each other by a predetermined distance to form a cell insert space into which a secondary battery cell is insertable, the plurality of compression plates movable towards each other to press a body of the secondary battery cell inserted into the cell insert space;
   a slip sheet having a sheet shape, the slip sheet including attachment portions attachable to top ends of the compression plates and a folding portion formed by folding a region between the attachment portions to be interposed in the cell insert space; and
   a plurality of slip sheet fixing units provided to be attached to and detached from the top ends of the compression plates in a fitting and releasing manner in a state where the attachment portions of the slip sheet are interposed therein.

2. The charging and discharging apparatus according to claim 1,
   wherein each slip sheet fixing unit includes:
      a slip sheet bracket provided to face the top end of a corresponding compression plate of the compression plates; and
      slip sheet fixing pins orthogonally coupled to a lower portion of the slip sheet bracket,
   wherein the slip sheet fixing pins are fitted into fitting grooves concavely formed at the top ends of the compression plates through the attachment portions of the slip sheet.

3. The charging and discharging apparatus according to claim 2, further comprising:
   a washer plate installed at the top end of the corresponding compression plate of the compression plates to face the slip sheet bracket,
   wherein one of the attachment portions of the slip sheet is compressed between the slip sheet bracket and the washer plate.

4. The charging and discharging apparatus according to claim 2,
   wherein the slip sheet bracket includes a plurality of unit slip sheet brackets that are separatable from each other.

5. The charging and discharging apparatus according to claim 2, further comprising:
   cell entry guides orthogonally coupled to an upper portion of each of the slip sheet brackets and shaped to have a surface inclined or curved toward the cell insert space.

6. The charging and discharging apparatus according to claim 5,
   wherein the cell entry guides are coupled to be slidable along a longitudinal direction of each of the slip sheet brackets and disposed at predesignated positions.

7. The charging and discharging apparatus according to claim 5,
   wherein each of the cell entry guides includes:
      a guide coupling portion slidably connected to a corresponding slip sheet bracket of the slip sheet brackets; and
      a guide-shaping portion integrally formed with the guide coupling portion, the guide-shaping portion having the surface inclined or curved toward the cell insert space.

8. The charging and discharging apparatus according to claim 7,
   wherein the guide coupling portion of the cell entry guide includes a ball plunger that is configured to move by rolling along an upper surface of the corresponding slip sheet bracket and is inserted into any one position setting groove of position setting grooves concavely formed at predesignated positions on the upper surface of the corresponding slip sheet bracket so that the guide coupling portion is movable and fixed fixable by the ball plunger.

9. The charging and discharging apparatus according to claim 7,
wherein each slip sheet bracket includes:
a guide movement region in which an upper body thereof has a width greater than a lower body thereof; and
a guide separation region in which an upper body and a lower body thereof have the same width, and
wherein the guide coupling portion of the cell entry guide is perpendicularly inserted into the guide separation region and surrounds the upper body of the guide movement region to prevent separation from the guide movement region in an upper and lower direction, and the guide coupling portion is configured to be caught by a lower end of the upper body in the upper and lower direction.

10. The charging and discharging apparatus according to claim 9,
wherein each slip sheet bracket includes a plurality of unit slip sheet brackets, which are separatable from each other, and the guide separation regions of the unit slip sheet brackets are disposed to be connected to each other.

11. The charging and discharging apparatus according to claim 1, further comprising:
gripper units respectively coupled to each compression plate of the plurality of compression plates to move integrally with each compression plate,
wherein, when adjacent compression plates compress the body of the secondary battery cell, the gripper units press and contact electrode leads of the secondary battery cell.

12. The charging and discharging apparatus according to claim 11, further comprising:
push bar units respectively mounted adjacent to the gripper units, the push bar units being configured to press a terrace portion of the secondary battery cell adjacent to the electrode lead.

13. The charging and discharging apparatus according to claim 1,
wherein the plurality of compression plates includes at least three compression plates, and
a total number of cell insert spaces is one less that a total number of the at least three compression plates.

* * * * *